United States Patent
Ibert et al.

(10) Patent No.: US 8,427,221 B2
(45) Date of Patent: Apr. 23, 2013

(54) ELECTRONIC DEVICE FOR MICROWAVE APPARATUSES ONBOARD A SATELLITE

(75) Inventors: Christophe Ibert, Toulouse (FR); Cecile Debarge, Labarthe/sur/Leze (FR)

(73) Assignee: Thales, Neuilly sur Seine (FR)

( * ) Notice: Subject to any disclaimer, the term of this patent is extended or adjusted under 35 U.S.C. 154(b) by 210 days.

(21) Appl. No.: 12/919,219

(22) PCT Filed: Dec. 16, 2008

(86) PCT No.: PCT/EP2008/067659
§ 371 (c)(1),
(2), (4) Date: Aug. 25, 2010

(87) PCT Pub. No.: WO2009/106183
PCT Pub. Date: Sep. 3, 2009

(65) Prior Publication Data
US 2010/0327933 A1    Dec. 30, 2010

(30) Foreign Application Priority Data
Feb. 26, 2008    (FR) ...................... 08 01036

(51) Int. Cl.
*H03K 5/08*    (2006.01)
(52) U.S. Cl.
USPC ........................................... 327/317

(58) Field of Classification Search .............. 327/317, 327/310, 311
See application file for complete search history.

(56) References Cited

U.S. PATENT DOCUMENTS
7,940,106 B2 *   5/2011   Laske et al. ................. 327/309

FOREIGN PATENT DOCUMENTS
JP    58121806    7/1983
JP    05235647    9/1993

* cited by examiner

*Primary Examiner* — Hai L Nguyen
(74) *Attorney, Agent, or Firm* — Baker & Hostetler LLP (57) ABSTRACT

The present invention includes a solution to the adherence to and improvement of the specifications regarding the conducted susceptibility of a microwave chain. It has an advantage of enabling significant attenuation of parasitic modulated signals carried in microwave chains of microwave devices such as those that are integrated into satellites by adding one or more 180° phase shifters between the units which do not exhibit a sufficient conducted susceptibility performance. The invention consequently makes it possible to do away with certain elements charged with the attenuation of the parasitic signals generally integrated into the power supplies and other DC/DC converters present in all contemporary microwave equipment.

8 Claims, 8 Drawing Sheets

ELECTRONIC DEVICE FOR MICROWAVE APPARATUSES ONBOARD A SATELLITE

CROSS-REFERENCE TO RELATED APPLICATIONS

This application is a National Stage of International patent application PCT/EP2008/067659, filed on Dec. 16, 2008, which claims priority to foreign French patent application No. FR 08 01036, filed on Feb. 26, 2008, the disclosures of which are incorporated by reference in their entirety.

FIELD OF THE INVENTION

The present invention consists of a solution to the adherence to and improvement of the specifications regarding the conducted susceptibility of a microwave chain, notably for equipment aboard satellites.

BACKGROUND OF THE INVENTION

Indeed, in current microwave equipment, parasitic signals of frequency generally lying between 10 Hz and 10 MHz are systematically generated by the primary bus of DC voltage converters and are found on the supply voltages of microwave circuits. These parasitic signals, of low frequency relative to the usual microwave frequencies, which are of the order of one to several tens of GHz, are difficult to filter and are transmitted on output from the microwave units.

The parasitic signals are thus carried by the microwave signals and may cause disturbances.

The conducted susceptibility makes it possible to measure the reaction of units in relation to parasitic signals. The attenuation of the parasitic signals will thus be measured, in dBc. The higher the conducted susceptibility, the more significant the attenuation of the parasitic signals and therefore the better the information transmission on the microwave circuit. The conducted susceptibility is therefore generally the subject of specification required when designing microwave equipment. This required conducted susceptibility is generally dependent on the frequencies of the parasitic signals: the higher the frequency, the higher the conducted susceptibility must be. For example, for parasitic signals at 10 MHz, a susceptibility of −55 dBc may be demanded. The closer the conducted susceptibility is to zero, the higher the power exhibited by the parasitic signals.

Currently, the attenuation of parasitic signals is done by adding complementary units, mainly at the level of the DC/DC converter, DC voltage converter, present on all microwave equipment. Indeed, the parasitic signals are essentially generated by the DC supply or by the DC/DC converter on account of its chopping frequencies. Polarization networks may make it possible to attenuate these parasitic signals.

Today, one of the favored avenues for improving microwave equipment aboard satellites resides in reducing the volume of DC/DC converters and making them lighter. One of the solutions is therefore to dispense with certain elements allowing the attenuation of parasitic signals.

However, there does not exist in the state of the art any means of substitution making it possible not to undergo the presence of parasitic signals at the microwave circuit level: this is the subject of the present patent application. The invention consists indeed of a microwave electronic device carrying out the attenuation of the parasitic modulated signals present at the input of said device, said parasitic modulated signals being transmitted to the microwave circuit by the DC/DC converter, and their frequency band being known since it is related to the chopping frequency of said DC/DC converter. The invention makes it possible to do away with the presence of units dedicated to the attenuation of the parasitic signals at the level of the DC/DC converter or of the power supply of the complete item of equipment. With the DC/DC converter representing today about 45% to 50% of the volume of the microwave equipment aboard satellites while the whole of the microwave chain represents about 20% thereof, the expected gain as regards volume is very significant.

SUMMARY OF THE INVENTION

For this purpose, the subject of the invention is an electronic device intended for microwave equipment intended to be carried aboard satellites, said microwave equipment comprising:
 a DC/DC converter providing a DC supply voltage and a parasitic modulated signal,
 a microwave chain propagating an input microwave signal at a high frequency and comprising at least two microwave electronic units: a first, exhibiting a microwave input supplied with the input microwave signal and at least one first power supply input supplied with voltage by said power supply, and providing as output an intermediate microwave signal, and a second exhibiting a microwave input supplied with the intermediate microwave signal and at least one second power supply input, and providing an output microwave signal,
said parasitic modulated signal being at least partially carried by the intermediate microwave signal as output of the first microwave electronic unit, characterized in that the device furthermore comprises a phase shifter applied to the supply voltage and to the parasitic modulated signal, situated between the first power supply input of the first microwave electronic unit and the second power supply input of the second microwave electronic unit, said phase shifter not forming part of said microwave chain as such, and making it possible to phase shift by 180° the parasitic modulated signal, and in that the supply voltage and the parasitic modulated signal phase-shifted by 180° supplies the second microwave electronic unit through the second power supply input, the parasitic modulated signal carried by the output microwave signal thereby being attenuated on account of the summation, in said output microwave signal, of the parasitic modulated signal and the parasitic modulated signal phase-shifted by 180°.

Generally, the parasitic modulated signal exhibits a low frequency, typically ten to ten million times lower than the frequency of the input microwave signal of the microwave chain.

Advantageously, the microwave chain comprises microwave electronic units of the type: amplifier(s), attenuator(s), voltage-controllable attenuator(s) (or VGA for Voltage Gain Attenuator).

Advantageously, the device according to the invention can comprise a series of microwave electronic units and a series of phase shifters making it possible to phase shift by 180° the parasitic modulated signal introduced with the supply voltage and carried by the microwave signal before each of the microwave electronic units most sensitive to the parasitic modulated signal.

Advantageously, an item of equipment aboard a satellite can comprise a microwave electronic device according to the invention.

BRIEF DESCRIPTION OF THE DRAWINGS

Other characteristics and advantages of the invention will become apparent with the aid of the description which follows given in regard to the appended drawings which represent:

FIG. 5b: the chart of the voltages measured by an oscilloscope on the circuit of FIG. 5a;

DETAILED DESCRIPTION

Figure 1:
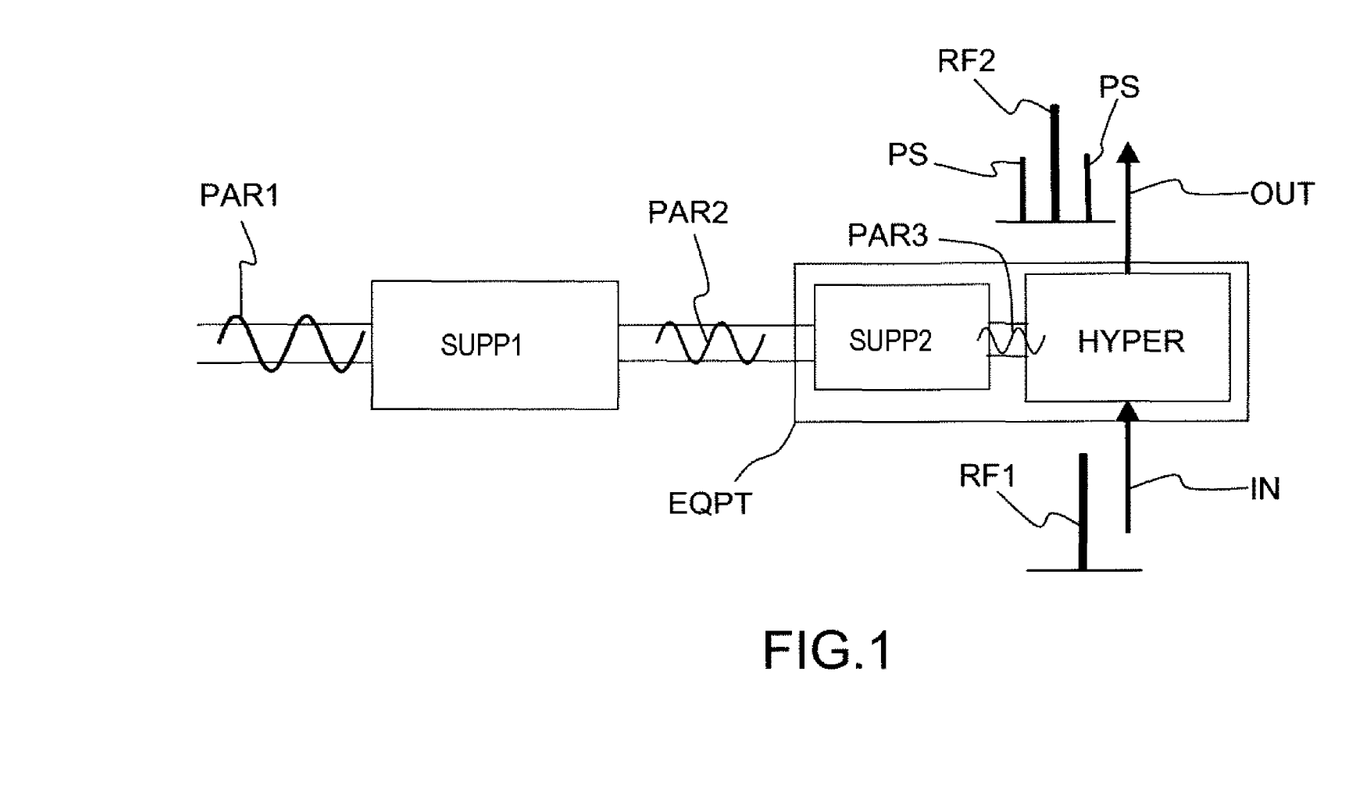
FIG. 1: the basic diagram of a contemporary microwave electronic device.

FIG. 1 illustrates a definition of the conducted susceptibility as level of parasitic glitches at the output of an item of microwave equipment. In the microwave electronic device schematically represented here, the line current carries a parasitic modulated signal PAR1. The primary circuit comprises a DC/DC converter SUPP1 whose role is to provide a DC voltage, of for example 100V. The parasitic modulated signal may be attenuated by the DC/DC converter SUPP1; it becomes the parasitic modulated signal PAR2, whose frequency band, related to the chopping frequency of the DC/DC converter SUPP1, may be known. In the secondary circuit, another secondary converter SUPP2 provides the microwave chain HYPER with the DC voltages necessary for the operation of its constituent microwave electronic units. The parasitic modulated signal PAR2 may be attenuated by the secondary converter SUPP2 and it is therefore a parasitic modulated signal PAR3 which reaches the microwave electronic units of the microwave chain HYPER. Moreover, a microwave signal represented by the amplitude modulation spectral line RF1 reaches the microwave chain HYPER through the input IN. At output OUT, the microwave chain HYPER provides a microwave signal represented by the amplitude modulation spectral line RF2. However, also found at output OUT are parasitic amplitude modulation spectral lines PS which correspond to the parasitic modulated signal PAR3 carried by the microwave signal on output from the microwave chain HYPER. The discrepancy between the spectral line RF2 and the spectral lines PS corresponds to the conducted susceptibility. The smaller the spectral lines PS relative to the spectral line RF2, the better the conducted susceptibility performance and the higher the quality of the output microwave signal.

Hitherto, the DC/DC converter SUPP1 ensured the crux of the necessary attenuation of the parasitic modulated signals. It was aided in this by the secondary converter SUPP2. Today, with a view to reducing the volume of microwave electronic equipment and making it lighter, in particular that aboard satellites, it is sought to simplify DC/DC converters such as SUPP1. This simplification results in a decrease in the attenuation of the parasitic modulated signals. Thus, a DC/DC converter SUPP1 that has been made lighter does not attenuate the parasitic modulated signal PAR1 sufficiently, and the parasitic modulated signal PAR3 which reaches the microwave chain HYPER therefore exhibits a high power and thus the microwave signal output by the microwave chain HYPER is disturbed.

Figure 2:
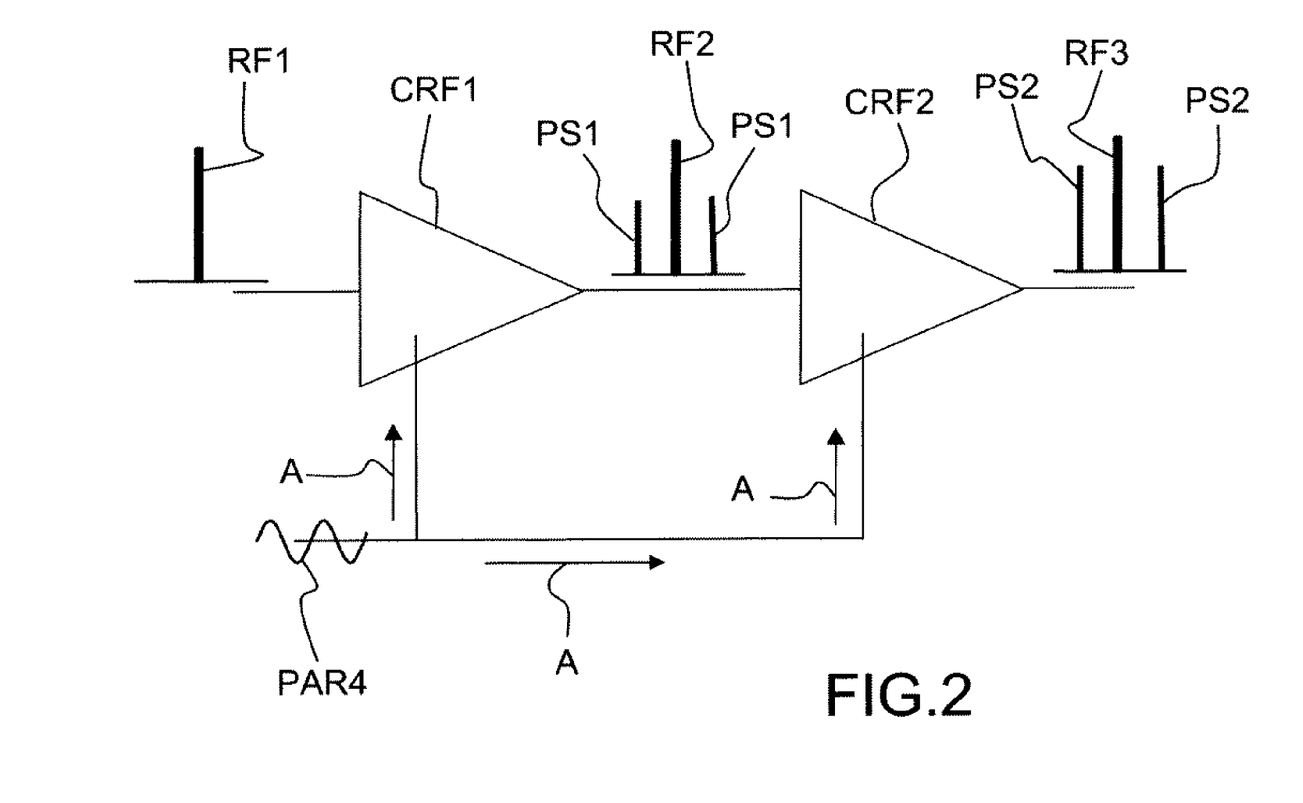
FIG. 2: the simplified representation of the principle of summing the parasitic signals passing through various microwave circuits.

The diagram of FIG. 2 makes it possible to appreciate another difficulty related to parasitic modulated signals. Indeed, the voltage A supplied to the microwave electronic units CRF1 and CRF2 is accompanied by a parasitic modulated signal PAR4. As has been explained previously, the microwave signal RF1 processed by the unit CRF1 becomes the microwave signal RF2 which carries parasitic signals PS1. After passing through the unit CRF2, a microwave signal RF3 carrying parasitic signals PS2 is obtained. These parasitic signals PS2 which disturb the microwave signal on output from the microwave chain represented in FIG. 2 correspond to the summation of the parasitic signals fed by the supply voltage, firstly to the unit CRF1, and then to the unit CRF2. Thus, it is noted that the conducted susceptibility performance is degraded as the microwave signal travels through units. FIG. 2 illustrates the fact that the amplitude modulation spectral lines of the parasitic signals get summed, this posing a major problem but also being at the source of the basic idea of the present invention.

Figure 3:
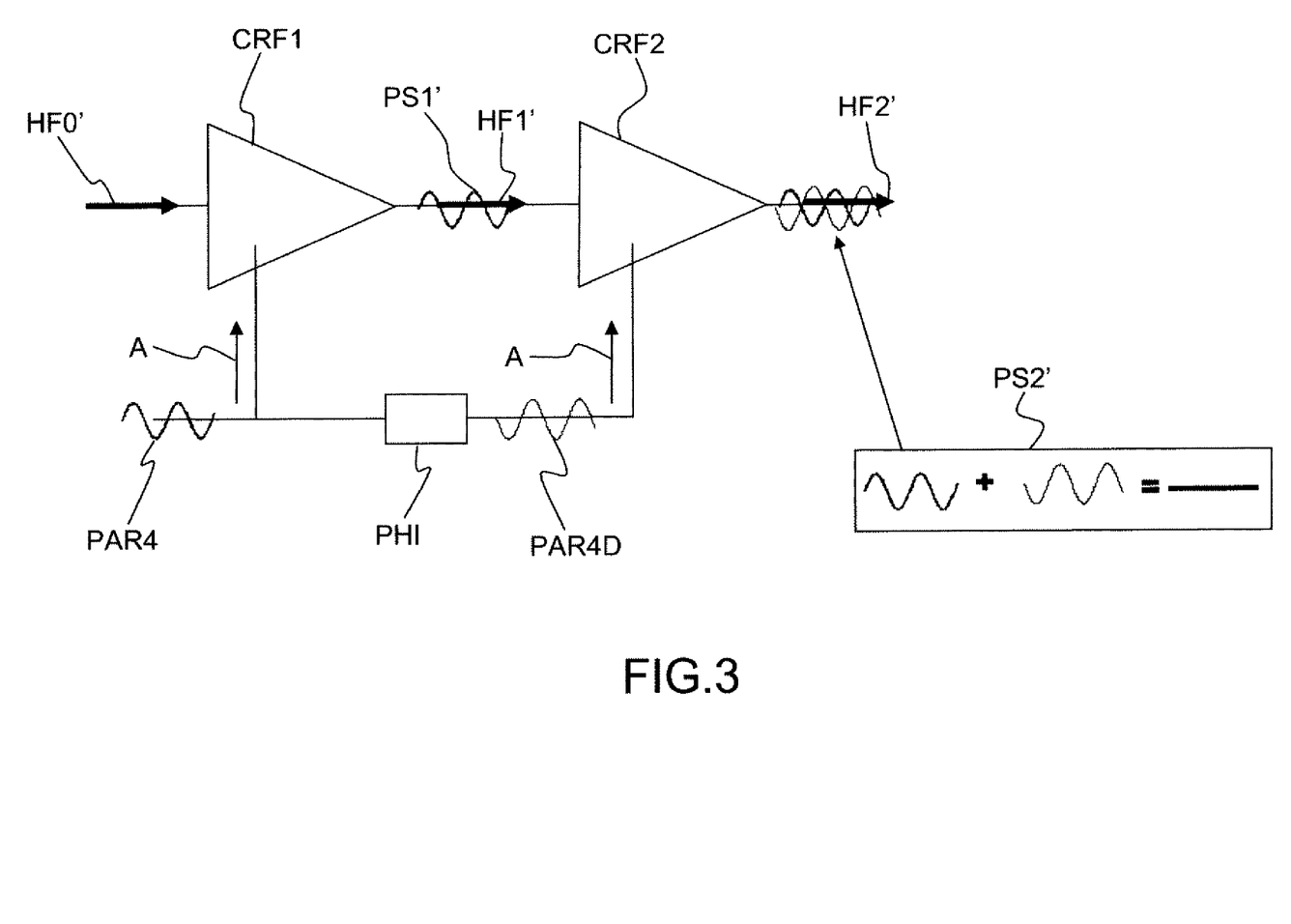
FIG. 3: the simplified diagram of the principle of the invention, consisting in phase shifting by 180° the parasitic signals between two microwave circuits.

FIG. 3 schematically represents the central idea exploited in the invention. One starts from almost the same microwave chain as that of FIG. 2. This time, the parasitic signals on the microwave line, in the guise of modulated signals, are represented by sinusoids rather than by their corresponding amplitude modulation spectral lines. Just as for FIG. 2, the supply voltage A of the unit CRF1 bears a parasitic modulated signal PAR4. The microwave signal HF0' is conveyed to the microwave input of the first unit CRF1 of the chain. On output from this unit CRF1, the microwave signal HF1' carries a parasitic signal PS1'. The invention thus consists mainly in placing a phase shifter PHI on the power supply bus with the aim of phase shifting by 180° the parasitic modulated signal PAR4 after it has reached the unit CRF1 but before it arrives at the second unit CRF2. The phase shifter PHI is placed in the secondary circuit of the equipment, and therefore does not belong to the microwave chain as such. The supply voltage A of the second unit CRF2 is therefore accompanied by a parasitic modulated signal phase-shifted by 180° PAR4D. Consequently, in the microwave signal HF2' output by the unit CRF2, the summation of the parasitic signals PS2', as explained when describing FIG. 2, is manifested, in a simplified manner, by the summation of the original parasitic modulated signal PAR4 and of the parasitic modulated signal phase-shifted by 180° PAR4D. As illustrated by FIG. 3, this summation tends to cancel out the parasitic modulated signal on account of the 180° phase shift.

Figure 4:
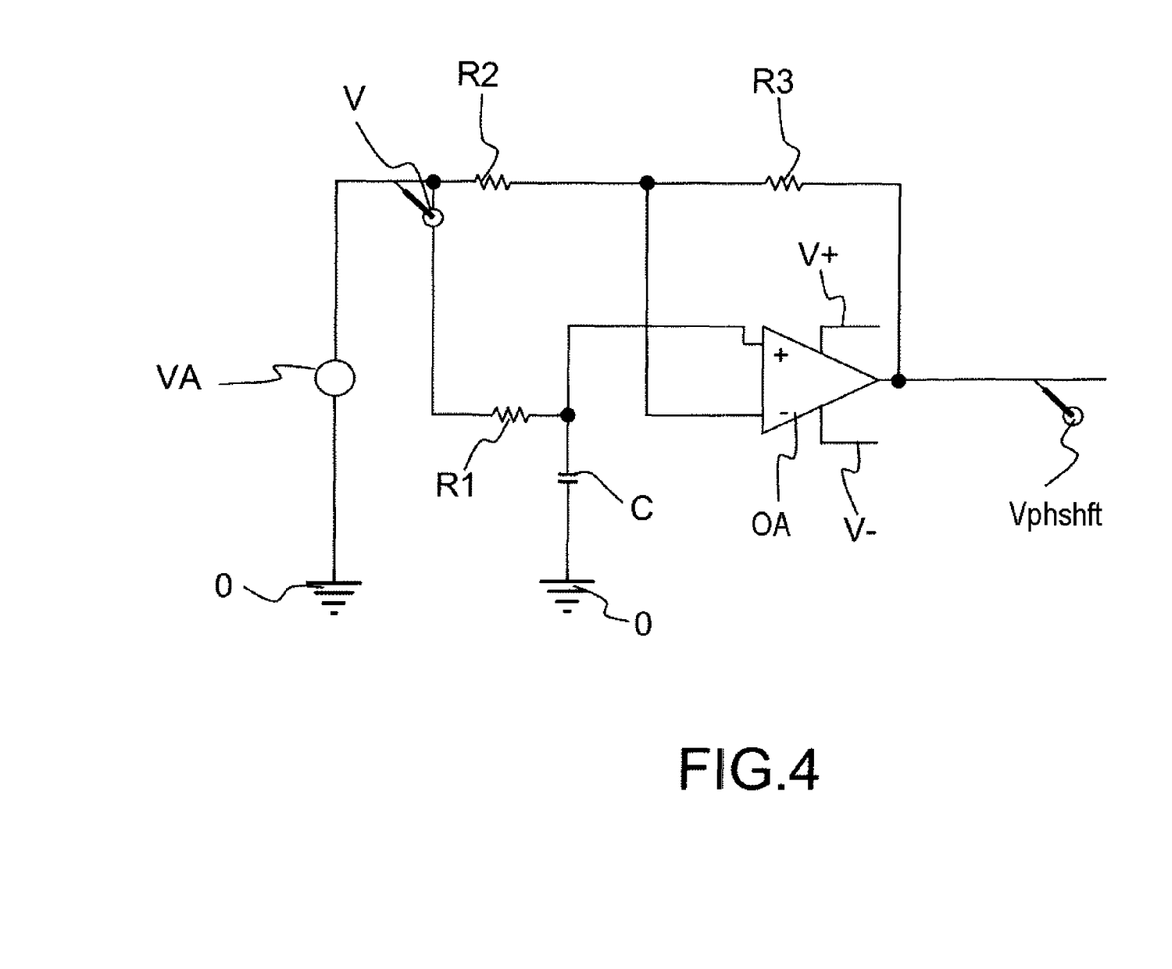
FIG. 4: the diagram of an exemplary electronic circuit making it possible to produce a 180° phase shifter used in the invention.

FIG. 4 presents an exemplary embodiment of a 180° phase shifter. This nonlimiting example comprises an operation amplifier OA, three resistors, R1 of 400 kΩ, R2 and R3 of 10 kΩ, and a capacitor C of 10 nF. By supplying this circuit with a sinusoidal voltage VA of 5 V and of frequency 10 kHz, it is possible to measure a phase shift of about 180° between the voltage measured at the point V and the voltage measured at the point Vphshft.

The following figures present tests and results making it possible to validate the principle of the invention experimentally.

Figure 5A:
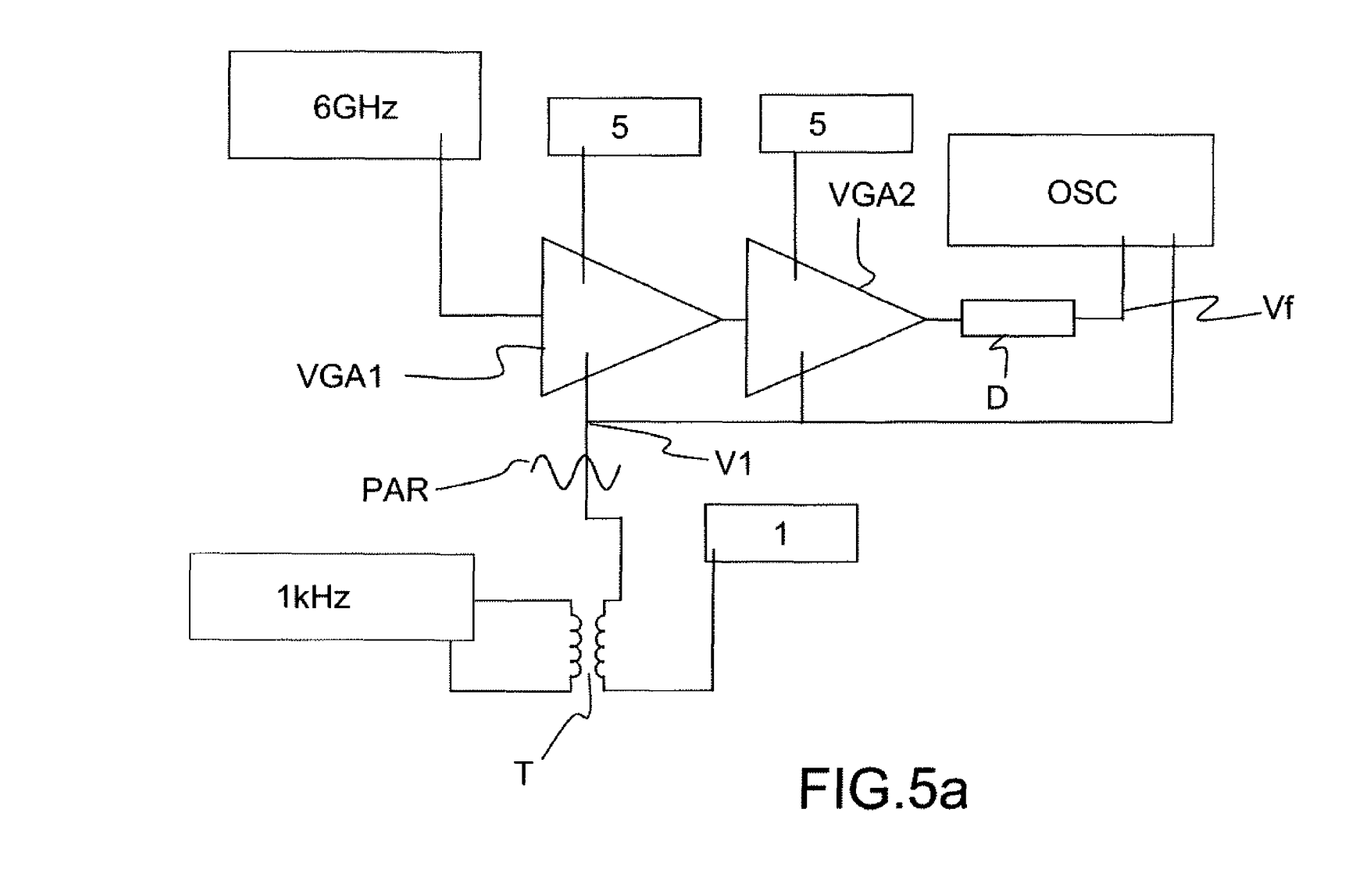
FIG. 5a: within the framework of the implementation of the invention, the diagram of a measurement rig applied to an arbitrary microwave electronic device, including two VGAs (the acronym standing for Voltage Gain Attenuator), a microwave electronic unit comprising an attenuator.

FIG. 5a presents the diagram of a mockup making it possible to measure with the oscilloscope OSC the level of the parasitic glitches on output from a microwave chain consisting of two VGAs (Voltage Gain Attenuators), VGA1 and VGA2, both supplied on their positive input with a DC supply 5 of +5 V and on their negative input with a supply voltage 1 of −1 V to which has intentionally been added a parasitic modulated component PAR with the aid of a generator of low-frequency signals 1 kHz passing through a transformer T. A 6 GHz frequency synthesizer provides a microwave signal to the input of the microwave chain and of the unit VGA1 in particular.

At the output of the microwave chain has been placed a detector D whose role is to make it possible to view the modulated component of the signal on output from the microwave chain with the aid of the oscilloscope OSC and to observe the phase levels between the various signals. The voltages are measured at the point V1 at the input of the negative power supply of the first unit VGA1 of the microwave chain and at the point Vf at the output of the chain, after the second unit VGA2. The results displayed by the oscilloscope OSC are represented in FIG. 5b.

Figure 5B:
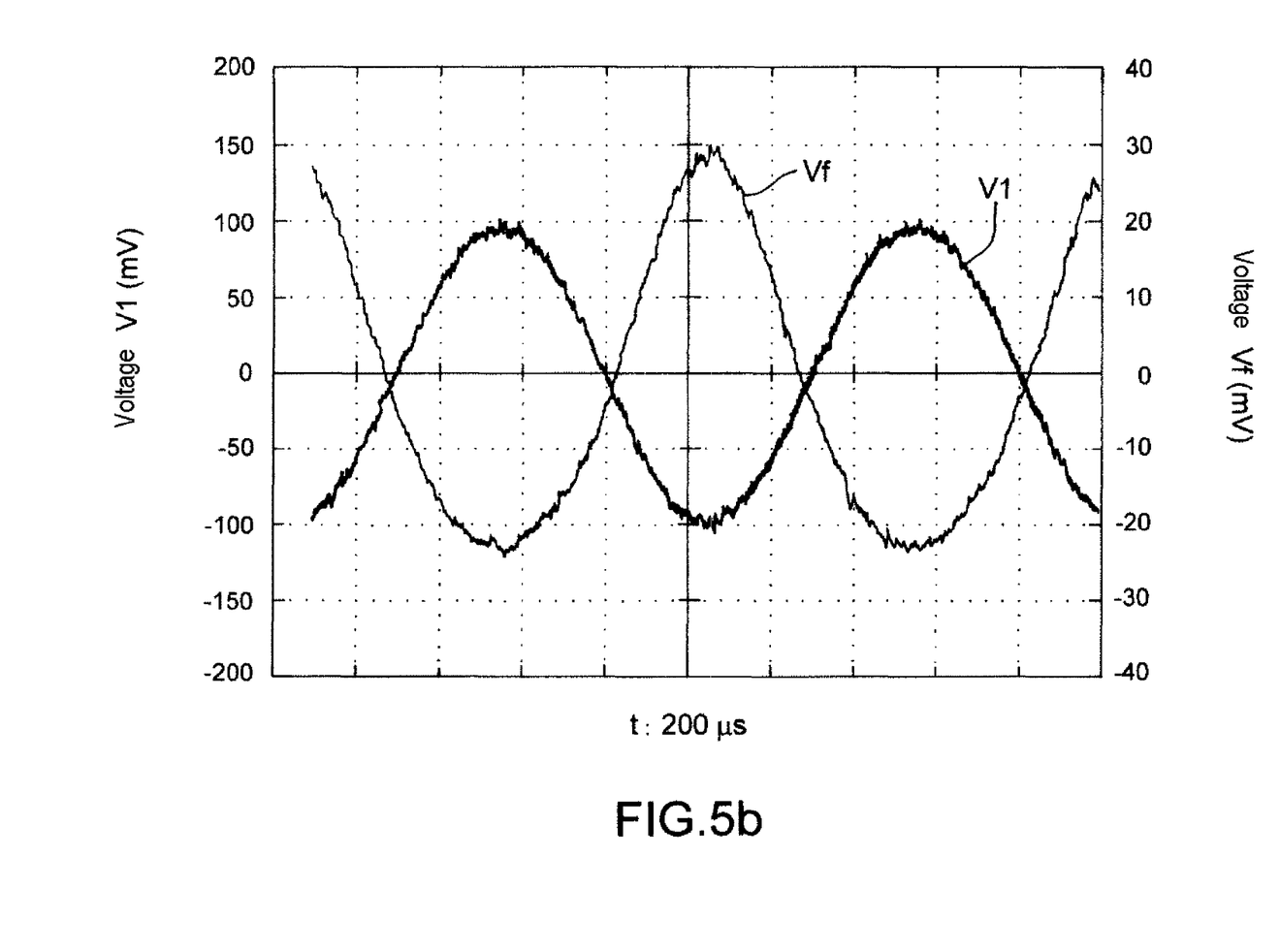

FIG. 5b makes it possible to note the large amplitude of the parasitic modulated signal in the voltage Vf measured on the microwave line at the output of the microwave chain. Experience shows that the fact of having two identical units in series multiplies this amplitude by four: it is about 54.4 mV here, whereas a measurement, not represented here, of the voltage at a point situated on the microwave line between the two units would display an amplitude of about 13.8 mV.

These measurements therefore show that the power of the parasitic modulated signals transmitted by a microwave chain and carried by the output microwave signal of a microwave device may be high. Furthermore, the more microwave units there are in the chain, the higher the amplitude of the parasitic signals.

Figure 6A:
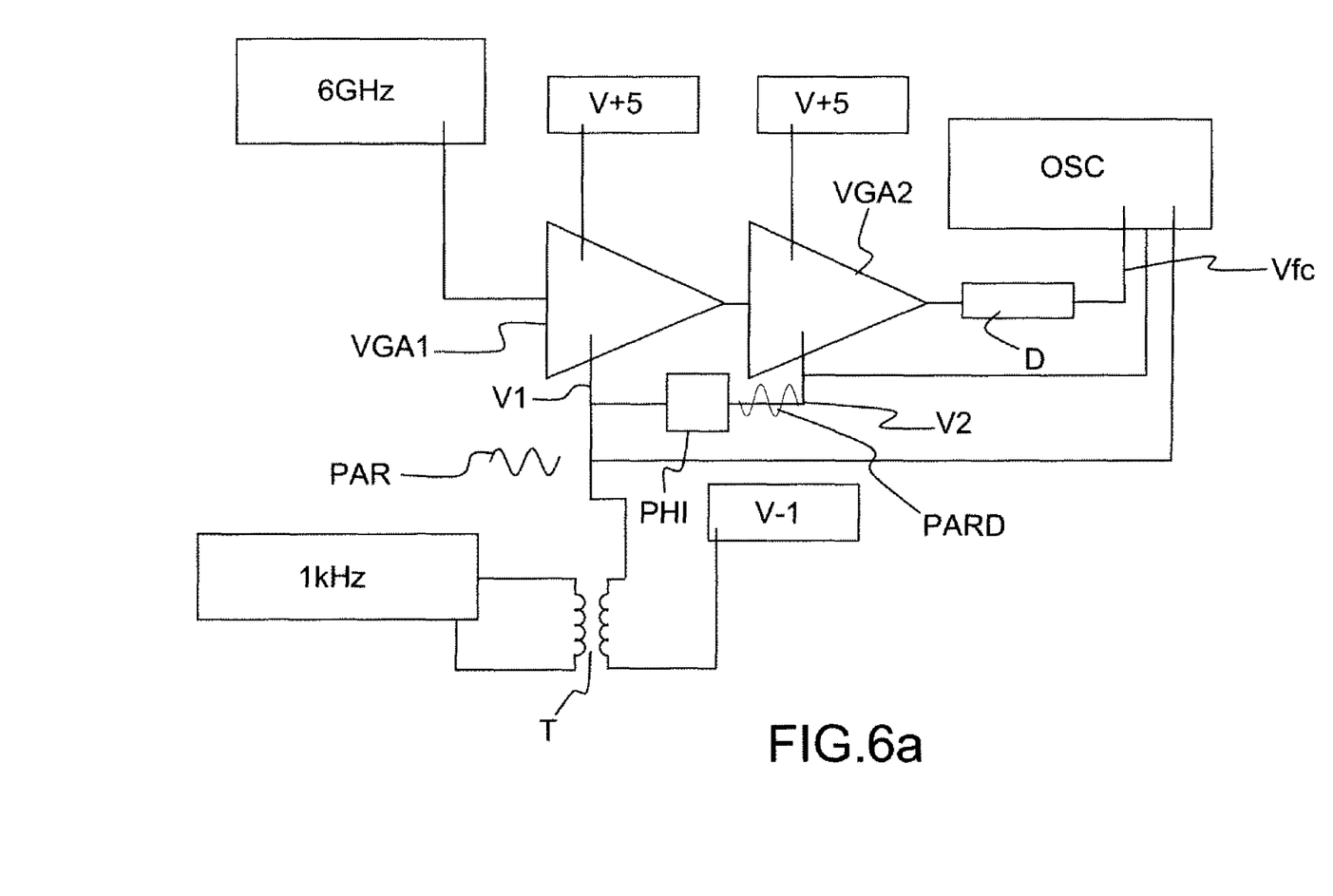
FIG. 6a: within the framework of the implementation of the invention, the diagram of a measurement rig applied to a microwave electronic device according to the invention based on the same circuit as that of FIG. 5a, and comprising a phase shifter placed between the two VGAs.

FIG. 6a presents the diagram of a mockup implementing the invention and making it possible to validate the principle thereof. With respect to the mockup of FIG. 5a, a 180° phase shifter PHI has been added between the negative inputs of the microwave units VGA1 and VGA2. The voltages measured with the oscilloscope OSC are: the voltage V1 at the negative input of the first unit VGA1, before the phase shifter PHI, the voltage V2 at the negative input of the second unit VGA2, after the phase shifter PHI, and the voltage Vfc at the output of the microwave chain. The results displayed by the oscilloscope OSC are represented in FIG. 6b.

Figure 6B:
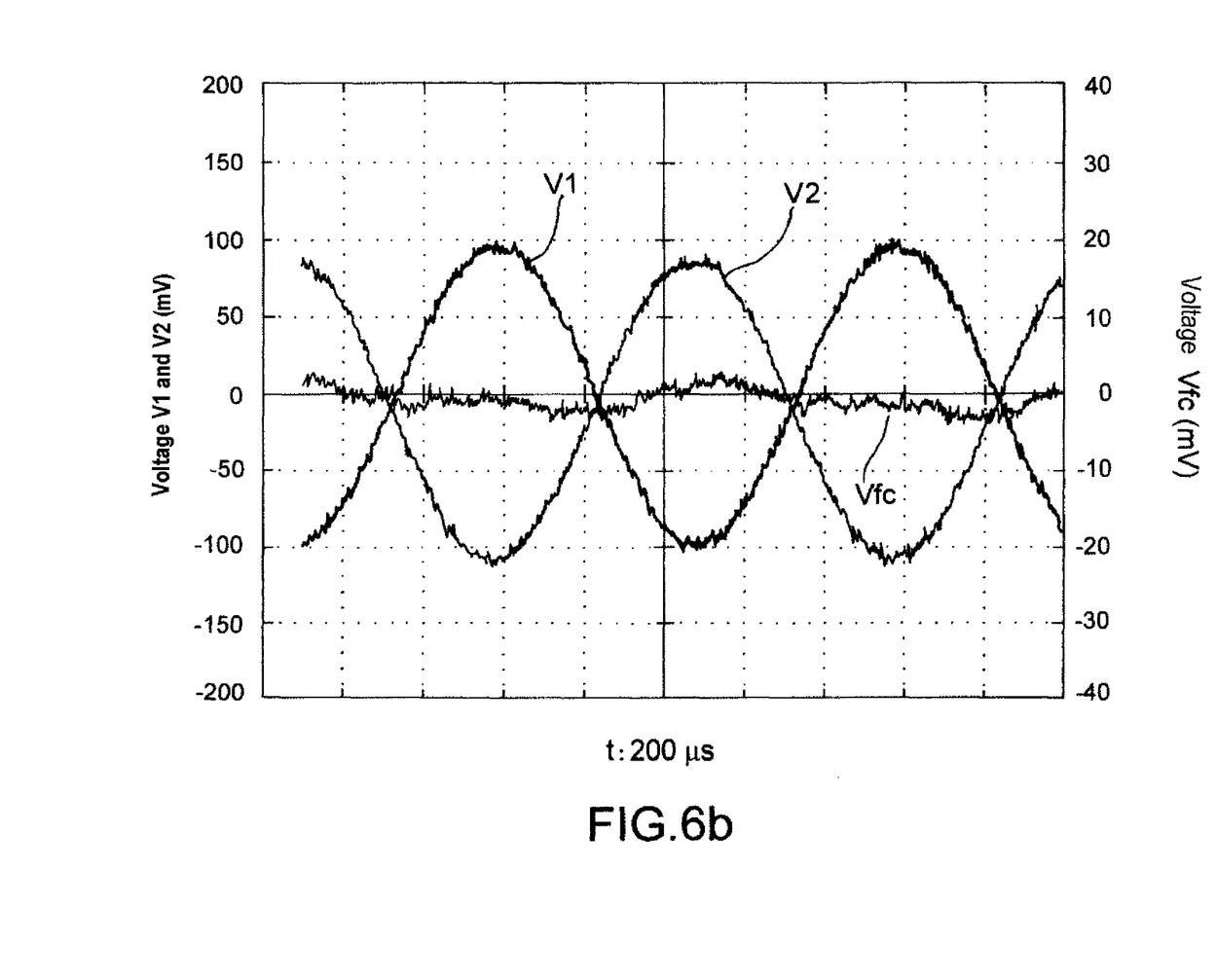
FIG. 6b: the chart of the voltages measured by an oscilloscope on the circuit of FIG. 5b.

In FIG. 6b, it is firstly seen that the voltages V1 and V2 are indeed phase-shifted by 180°. It is then noted that the level of the parasitic modulated signal measured at the output of the microwave chain, namely the voltage Vfc, is extremely low. Its amplitude is not measurable; it is in any event negligible.

This result validates the principle of the invention. The summation within the second unit VGA2 of the parasitic signal carried by the microwave signal on output from the first unit VGA1, which arrives at the microwave input of the unit VGA2, and of the 180° phase-shifted parasitic signal PARD, which arrives at the negative input of the unit VGA2, culminates in a large decrease in the parasitic modulated signal in the output signal of the microwave chain.

To summarize, the invention has the main advantage of enabling significant attenuation of the parasitic modulated signals carried in the microwave chains of microwave devices such as those that are integrated into satellites by simply adding one or more 180° phase shifters between the units which do not exhibit a sufficient conducted susceptibility performance. It makes it possible, consequently, to appreciably improve the conducted susceptibility performance of a microwave chain without adding any element to said microwave chain, the phase shifter PHI being placed in the secondary circuit of the item of equipment.

The invention furthermore makes it possible to do away with certain elements charged with the attenuation of the parasitic signals generally integrated into the power supplies and other DC/DC converters in all contemporary microwave equipment. The gain as regards weight and volume over the entirety of microwave equipment is very significant, this constituting a benefit of paramount interest within the framework of equipment intended to be carried aboard satellites.

The invention claimed is:

1. An electronic device intended for microwave equipment intended to be carried aboard satellites, said electronic device comprising:
   a DC/DC converter providing a DC supply voltage and a parasitic modulated signal (PAR4);
   a microwave chain propagating an input microwave signal at a high frequency and comprising at least two microwave electronic units:
   a first microwave electronic unit, exhibiting a microwave input supplied with the input microwave signal and at least one first power supply input supplied with voltage of said at least one first power supply, and providing as output an intermediate microwave signal; and
   a second microwave electronic unit, exhibiting a microwave input supplied with said intermediate microwave signal and at least one second power supply input, and providing an output microwave signal, said parasitic modulated signal being at least partially carried by said intermediate microwave signal as output of said first microwave electronic unit; and
   a phase shifter applied to said supply voltage and to said parasitic modulated signal, situated between said first power supply input of said first microwave electronic unit and said second power supply input of said second microwave electronic unit, said phase shifter not forming part of said microwave chain as such, and making it possible to phase shift by 180° said parasitic modulated signal, and in that said supply voltage and said parasitic modulated signal phase-shifted by 180° supplies said second microwave electronic unit through said second power supply input, said parasitic modulated signal carried by said output microwave signal (HF2') thereby being attenuated on account of summation, in said output microwave signal, of said parasitic modulated signal and said parasitic modulated signal phase-shifted by 180°.

2. The electronic device as claimed in claim 1, wherein said parasitic modulated signal exhibits a low frequency, ten to ten million times lower than frequency of the input microwave signal of the microwave chain.

3. The electronic device as claimed in claim 1, wherein said first and second microwave electronic units are selected from at least one of: amplifier(s), attenuator(s), voltage-controllable attenuator(s) (or VGA for Voltage Gain Attenuator).

4. The electronic device as claimed in claim 1, further comprising
   a series of microwave electronic units; and a series of phase shifters making it possible to phase shift by 180° said parasitic modulated signal introduced with the supply voltage and carried by the microwave signal before each of the microwave electronic units most sensitive to said parasitic modulated signal.

5. The electronic device as claimed in claim 1, wherein the electronic device is incorporated with an item of equipment aboard a satellite.

6. The electronic device as claimed in claim 2, wherein the electronic device is incorporated with an item of equipment aboard a satellite.

7. The electronic device as claimed in claim 3, wherein the electronic device is incorporated with an item of equipment aboard a satellite.

8. The electronic device as claimed in claim 4, wherein the electronic device is incorporated with an item of equipment aboard a satellite.

* * * * *